(12) United States Patent
Haratsch

(10) Patent No.: US 7,587,657 B2
(45) Date of Patent: Sep. 8, 2009

(54) METHOD AND APPARATUS FOR ITERATIVE ERROR-ERASURE DECODING

(75) Inventor: Erich Franz Haratsch, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 523 days.

(21) Appl. No.: 11/119,038

(22) Filed: Apr. 29, 2005

(65) Prior Publication Data

US 2006/0248435 A1 Nov. 2, 2006

(51) Int. Cl.
H03M 13/00 (2006.01)
(52) U.S. Cl. .................... 714/780; 714/765
(58) Field of Classification Search .............. 714/780, 714/765
See application file for complete search history.

(56) References Cited

U.S. PATENT DOCUMENTS

| | | | | |
|---|---|---|---|---|
| 4,637,021 A | * | 1/1987 | Shenton | 714/756 |
| 4,835,772 A | * | 5/1989 | Peile et al. | 714/762 |
| 4,845,713 A | * | 7/1989 | Zook | 714/784 |
| 5,452,310 A | * | 9/1995 | Arts | 714/781 |
| 5,541,939 A | * | 7/1996 | Im | 714/765 |
| 5,636,253 A | * | 6/1997 | Spruyt | 375/348 |
| 5,732,093 A | * | 3/1998 | Huang | 714/765 |
| 6,029,264 A | * | 2/2000 | Kobayashi et al. | 714/755 |
| 6,065,149 A | * | 5/2000 | Yamanaka | 714/780 |
| 6,553,536 B1 | * | 4/2003 | Hassner et al. | 714/780 |
| 6,654,926 B1 | * | 11/2003 | Raphaeli et al. | 714/780 |
| 7,237,173 B2 | * | 6/2007 | Morita et al. | 714/755 |

OTHER PUBLICATIONS

Bajcsy, J.; Chan-Vee Chong; Garr, D.A.; Hunziker, J.; Kobayashi, H.; On iterative decoding in some existing systems, IEEE Journal on Selected Areas in Communications, vol. 19, Issue 5, May 2001, pp. 883-890.*
Bajcsy, J.; Hunziker, J.A.; Kobayashi, H.; Iterative decoding for digital recording systems; IEEE Global Telecommunications Conference <The Bridge to Global Integration>; Nov. 8-12, 1998, pp. 2700-2705 vol. 5.*
Hagenauer et al., "A Viterbi Algorithm with Soft-Decision Outputs and its Applications," IEEE Global Telecommunications Conference (Globecom), vol. 3, pp. 1680-1686 (Nov. 1989).

(Continued)

Primary Examiner—Joseph D Torres
(74) Attorney, Agent, or Firm—Ryan, Mason & Lewis, LLP

(57) ABSTRACT

Methods and apparatus are provided for improved iterative error-erasure decoding. A signal is decoded by obtaining a plurality of symbols associated with the signal and one or more corresponding reliability values; generating at least one erasure list comprised of L symbols and at least one shortened erasure list comprised of L' symbols, where L' is less than L; and constructing an erasure set by taking erasures from at least one of the erasure list and the shortened erasure list. A signal is also processed by generating one or more reliability values using a soft-output detector; generating an erasure list of symbols by comparing the reliability values to at least one reliability threshold value (or by sorting); and performing error erasure decoding using the erasure list. The size of the erasure list can optionally be adjusted using feedback information.

15 Claims, 5 Drawing Sheets

OTHER PUBLICATIONS

Keirn et al., "Use of Redundant Bits for Magnetic Recording: Single-Parity Codes and Reed-Solomon Error-Correcting Code," IEEE Transactions on Magnetics, vol. 40, No. 1, pp. 225-230 (Jan. 2004).

Reggiani et al, "On Reverse Concatenation and Soft Decoding Algorithms for PRML Magnetic Recording Channels," IEEE Journal on Selected Areas in Communications, vol. 19, No. 4, pp. 612-618 (Apr. 2001).

Robertson et al., "A Comparison of Optimal and Sub-Optimal MAP Decoding Algorithms Operating in the Log Domain," IEEE International Conference on Communications, Gateway to Globalization, vol. 2, pp. 1009-1013 (Jun. 18-22, 1995).

* cited by examiner

FIG. 5

$$\overbrace{\binom{7}{2}+\binom{7}{4}+\binom{7}{6}}^{510}+\overbrace{\binom{8}{8}+\binom{10}{10}+\cdots+\binom{20}{20}}^{k=8}$$

$$\underbrace{\binom{7}{2}+\binom{7}{4}+\binom{7}{6}}_{520}+\underbrace{\binom{8}{8}+\binom{10}{10}+\cdots+\binom{20}{20}}_{530}$$

$$\underbrace{\binom{8}{2}+\binom{8}{4}+\binom{8}{6}+\binom{8}{8}}_{560}+\underbrace{\binom{10}{10}+\cdots+\binom{20}{20}}_{570}$$

550

FIG. 7
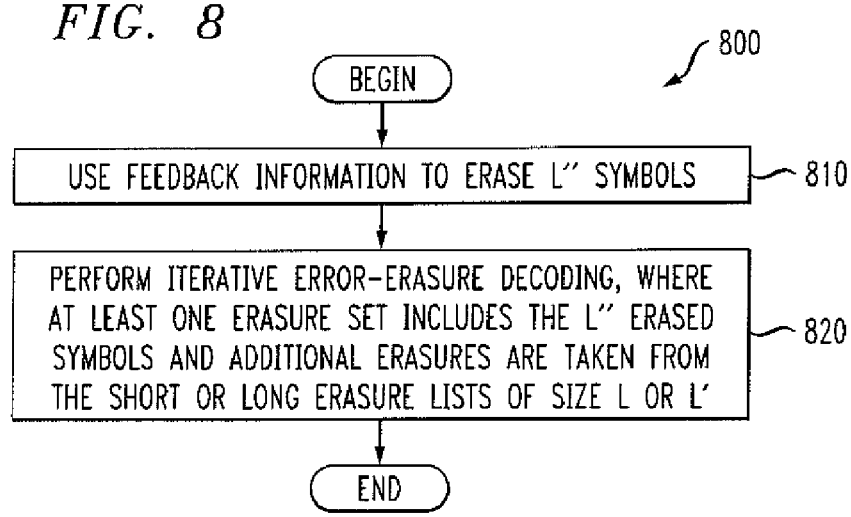
FIG. 8
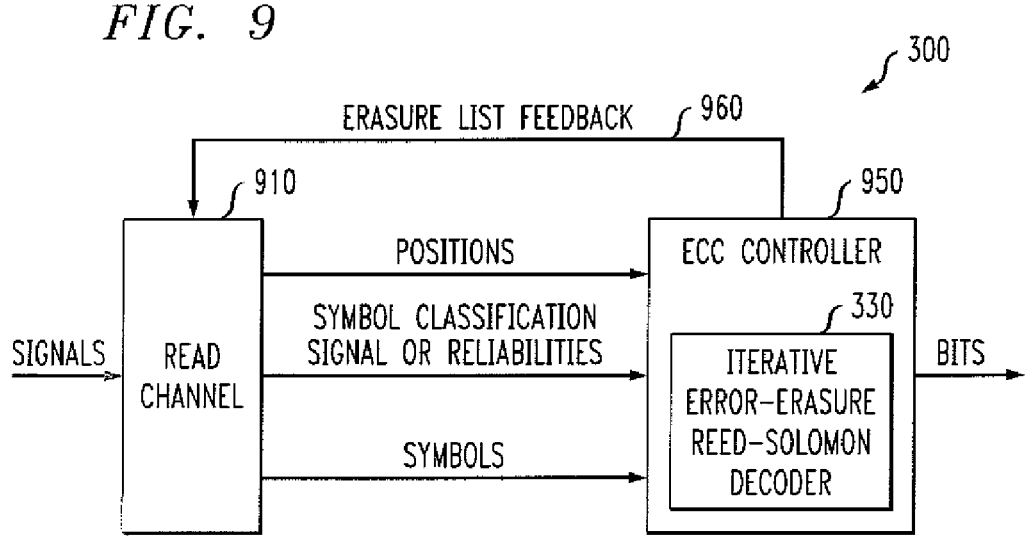
FIG. 9

METHOD AND APPARATUS FOR ITERATIVE ERROR-ERASURE DECODING

FIELD OF THE INVENTION

The present invention relates generally to magnetic recording systems and, more particularly, to techniques for iterative error-erasure decoding in such magnetic recording systems.

BACKGROUND OF THE INVENTION

Error correcting codes, such as Reed-Solomon codes, have a wide range of applications in digital communications and storage. Reed-Solomon codes, for example, add redundant bits to a digital stream prior to transmission or storage, so that a decoder can detect and possibly correct errors caused by noise or other interference. Generally, a Reed-Solomon encoder takes a block of digital data, comprising a sequence of digital information bits, and interprets the data as a sequence of information symbols. Each symbol comprises m bits of the digital information sequence. The block of input data comprises r such information symbols. The Reed-Solomon encoder produces p additional redundant symbols, which are concatenated with the k information symbols to form a codeword comprising n (equal to r plus p) symbols.

Errors occur during transmission or storage for a number of reasons, such as noise, interference, or defects on a storage medium. A Reed-Solomon decoder processes each block and attempts to correct errors and recover the original data. The number and type of errors that can be corrected depends on the characteristics of the Reed-Solomon code. In general, an RS(n,r) decoder can correct any combination of up to T=p/2 corrupted symbols per codeword provided that the remainder of the n symbols of the codeword are correct.

A Viterbi detector is typically used in a read channel of a magnetic recording system to detect the read data bits in the presence of intersymbol interference and noise. Thereafter, a Reed-Solomon decoder is often applied to correct any errors in the detected data and recover the original data. Nonetheless, a number of errors often remain. Thus, a number of techniques have been proposed or suggested for performing error-erasure Reed-Solomon decoding when such hard Reed-Solomon decoding fails. Generally, an error-erasure Reed-Solomon decoder evaluates reliability information associated with the detected data and repeatedly performs error-erasure decoding using the hard decision bits provided by the Viterbi detector and an erasure list until there is no decoding error. Such reliability information may be obtained, for example, from a Soft-Output Viterbi Algorithm (SOVA).

While such proposed error-erasure decoding techniques improve the performance of Reed-Solomon decoders, they suffer from a number of limitations, which if overcome, could lead to better error rate performance achievable by magnetic recording systems. In addition, previous techniques for error-erasure decoding are too complex for a practical implementation. A need therefore exists for improved techniques for error-erasure decoding that improve the performance of magnetic recording systems with manageable hardware cost or computational effort. An error-erasure decoding system incorporating these improved techniques is referred to as iterative error-erasure decoding system.

SUMMARY OF THE INVENTION

Generally, methods and apparatus are provided for improved iterative error-erasure decoding. According to one aspect of the invention, a signal is decoded by obtaining a plurality of symbols associated with the signal and one or more corresponding reliability values; generating at least one erasure list comprised of L symbols and at least one shortened erasure list comprised of L' symbols, where L' is less than L; and constructing an erasure set by taking erasures from at least one of the erasure list and the shortened erasure list.

According to another aspect of the invention, a signal is processed by generating one or more reliability values using a soft-output detector; generating an erasure list of symbols by comparing the reliability values to at least one reliability threshold value; and performing error erasure decoding using the erasure list. In a further variation, an erasure list can be obtained by sorting the reliability values, and the size of the erasure list can be optionally adjusted based on feedback information.

A more complete understanding of the present invention, as well as further features and advantages of the present invention, will be obtained by reference to the following detailed description and drawings.

BRIEF DESCRIPTION OF THE DRAWINGS

FIG. 5 illustrates the processing of symbols by the erasure list generation process of FIG. 4;

FIG. 7 illustrates the processing of symbols by the erasure list generation process of FIG. 6;

FIG. 8 is a flow chart describing an exemplary implementation of a second alternative iterative error-erasure decoding process that may be implemented by the iterative error-erasure decoding system of FIG. 3; and FIG. 9 is a schematic block diagram further illustrating the implementation of the iterative error-erasure decoding system of FIG. 3 in a magnetic recording system.

DETAILED DESCRIPTION

Figure 1:
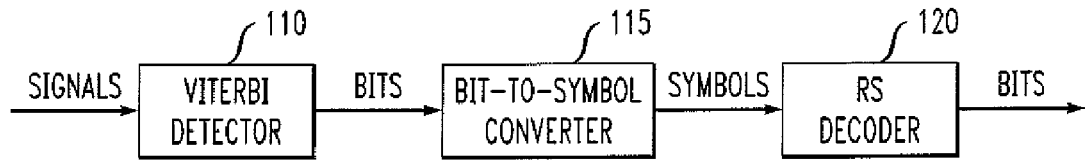
FIG. 1 is a schematic block diagram of a conventional magnetic storage detection system employing concatenated Viterbi detection and Reed-Solomon decoding.

FIG. 1 is a schematic block diagram of a conventional magnetic storage detection system 100 employing concatenated Viterbi detection and Reed-Solomon decoding. As shown in FIG. 1, a received signal is processed by a Viterbi detector 110 that produces detected bits. The detected bits are optionally converted to symbols by a bit-to-symbol converter 115 and the generated symbols are processed by a Reed-Solomon decoder 120, in a known manner. For a more detailed discussion of suitable conventional magnetic storage detection systems 100, see, for example, Z. A. Keirn et el., "Use of Redundant Bits for Magnetic Recording: Single-Parity Codes and Reed-Solomon Error-Correcting Code," IEEE Transactions on Magnetics, Vol. 40, 225-230 (January 2004).

Figure 2:
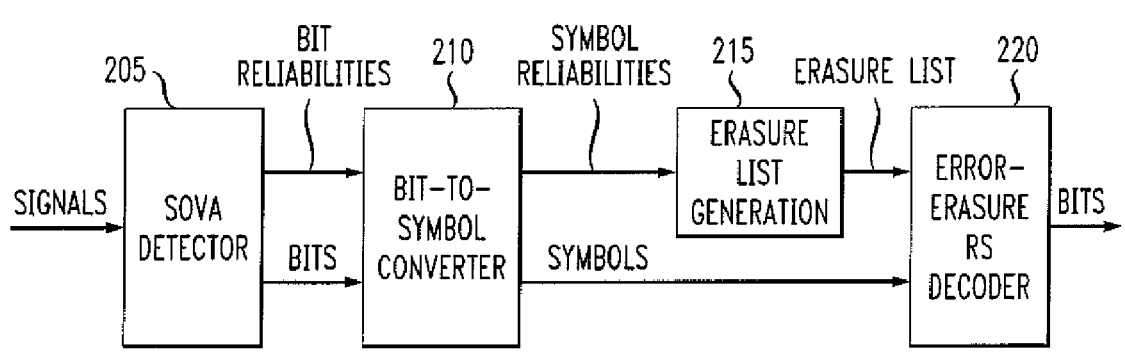
FIG. 2 is a schematic block diagram of a conventional error-erasure decoding system.

FIG. 2 is a schematic block diagram of a prior art error-erasure decoding system 200. As shown in FIG. 2, a received signal is initially processed by a SOVA detector 205 that produces detected bits and corresponding bit reliability values. The reliabilities generated by the SOVA detector 205 can be used by an outer decoder to improve the error rate performance of the overall system, in a known manner. For a more detailed discussion of suitable SOVA detectors, see, for example, J. Hagenauer and P. Hoeher, "A Viterbi Algorithm with Soft-decision Outputs and its Applications," IEEE Global Telecommunications Conference (GLOBECOM), vol. 3, 1680-1686 (November 1989).

The detected bits and corresponding bit reliability values are optionally converted to symbols by a bit-to-symbol converter 210. The bit-to-symbol converter 210 may derive symbol reliability values from bit reliability values, for example, by setting the reliability of a symbol equal to the reliability of the least reliable bit within this symbol. The bit-to-symbol converter 210 also groups sets of detected bits into detected symbols, where each symbol comprises m bits.

An erasure list generation function 215 processes the symbol reliability values to identify the most unreliable symbols. For example, the erasure list generated by the erasure list generation function 215 may comprise the L most unreliable symbols in a sector on the hard disk drive. The erasure list generation function 215 may generate the erasure list by sorting the reliability values to identify the L most unreliable symbols in a sector (L can be equal to 2, 3, . . . , or 2T). The computational effort associated with such sorting grows with the sector size, and is often prohibitive.

An error-erasure Reed-Solomon decoder 220 repeatedly performs error-erasure decoding using the hard symbol decisions and combinations of erasures chosen from the erasure list until there is no decoding error. For example, the iterative error-erasure Reed-Solomon decoder 220 may decode iteratively with 0, 2, . . . L erasures (in any combination) until no decoding error occurs. For a more detailed discussion of prior art error-erasure Reed-Solomon decoding, see, for example, L. Reggiani and G. Tartara, "On Reverse Concatenation and Soft Decoding Algorithms for PRML Magnetic Recording Channels," IEEE Journal on Selected Areas in Communications, vol. 19, 612-618 (April 2001), incorporated by reference herein.

Generally, the error-erasure Reed-Solomon decoder 220 decodes successively with 0, 2, 4, . . . , L (L−1 if L is odd) erasures until there is no decoding error. For example, the error-erasure Reed-Solomon decoder 220 might first decode with no erasures. If there is a decoding error, the error-erasure Reed Solomon decoder might decode with all possible combinations of two erasures taken out of the list with L unreliable symbols (number of combinations: L over 2) and then decode with all possible combinations of four erasures taken out of the list with L unreliable symbols (number of combinations: L over 4), and so on. The number of combinations becomes very large for large erasure lists (i.e., for large L) and exceeds 100 for L greater than seven. The complexity can be significantly decreased (although at the expense of diminished performance) by considering only erasures with the lowest reliabilities for the construction of erasure sets. For example, decoding with the two best erasures (i.e., the two most unreliable symbols are erased), and then the four best erasures (i.e., the four most unreliable symbols are erased), and so on.

Figure 3:
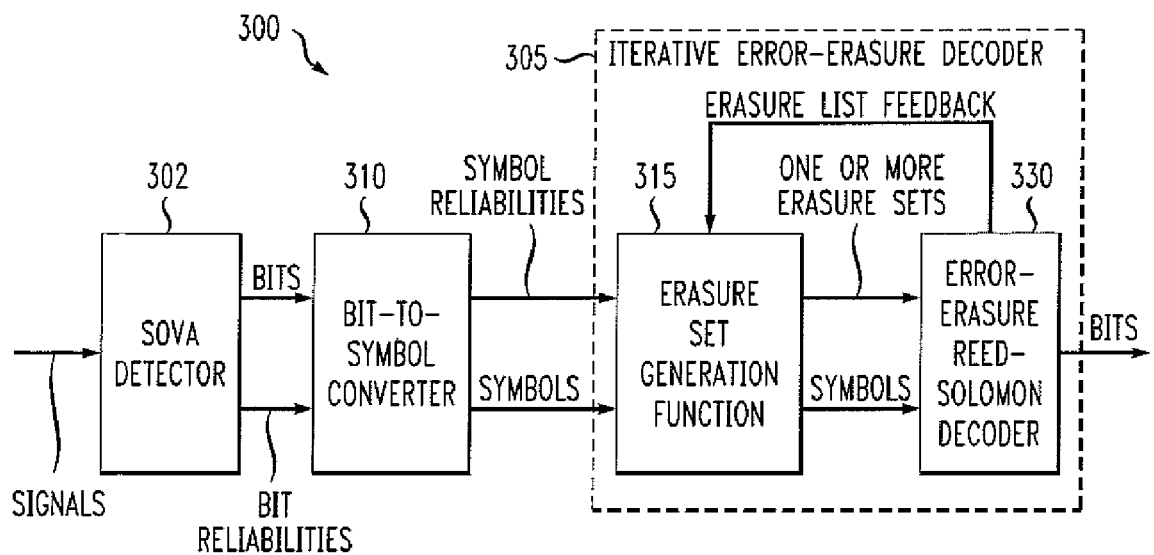
FIG. 3 is a schematic block diagram of an iterative error-erasure decoding system incorporating features of the present invention.

FIG. 3 is a schematic block diagram of an improved error-erasure decoding system 300, referred to as iterative error-erasure decoding system 300, incorporating features of the present invention. The SOVA detector 302 could be replaced by other soft-output detectors, such as maximum-a-posteriori (MAP) detectors, or (Max-)Log-MAP detectors. For a discussion of MAP algorithms, see, for example, P. Robertson et al., "A Comparison of Optimal and Sub-Optimal MAP Decoding Algorithms Operating in the Log Domain," 1995 IEEE International Conference on Communications (ICC), vol. 2, 1009-1013, (June 1995).

As shown in FIG. 3, the detected bits and corresponding bit reliability values produced by the SOVA detector 302 are processed by a bit-to-symbol converter 310 that may derive symbol reliability values from bit reliability values, for example, by setting the reliability of a symbol equal to the reliability of the least reliable bit within this symbol. The bit-to-symbol converter 310 also groups sets of detected bits into detected symbols, where each symbol comprises m bits.

The present invention provides improved techniques for generating erasure sets and for iterative error-erasure decoding. As shown in FIG. 3, the erasure set generation function 315 and the error-erasure Reed-Solomon decoder 330 are collectively referred to herein as iterative error-erasure decoder 305. In accordance with one aspect of the invention, the iterative error-erasure decoder 305 implements one or more novel iterative error-erasure decoding processes 400, 600, 800, discussed below in conjunction with FIGS. 4, 6 and 8, respectively, that determine which symbols to erase and combine different erasures out of the erasure list for iterative error-erasure decoding. The iterative error-erasure decoding processes 400, 600, 800 can be implemented with manageable hardware cost or computational effort (in a software or firmware implementation). The iterative error-erasure decoder 305, erasure set generation function 315 and the error-erasure Reed-Solomon decoder 330 can be implemented as one or more processors, such as digital signal processors, microprocessors, or a dedicated processing circuit that performs the features and functions of the present invention, as described herein.

According to one aspect of the invention, discussed further below in conjunction with FIGS. 4, 6 and 8, the iterative error-erasure decoding processes 400, 600, 800 may employ one or more thresholds to generate the erasure lists and, optionally, to assign the unreliable symbols into one of a plurality of categories or groups. For example, one threshold can be employed to group symbols into a reliable category or an unreliable category, where each symbol with a symbol reliability below a threshold falls into the unreliable category. Similarly, another threshold can be employed to group unreliable symbols into an unreliable category or a very unreliable category, where each symbol with a symbol reliability below this threshold falls into the very unreliable category. It is noted that the use of one or more thresholds in accordance with the present invention is less complex than conventional sorting techniques for generating the erasure list. Thereafter, further processing can be performed on the symbols in each category or group. In another variation, the erasure set generation function 315 can employ a threshold to mark the K most unreliable candidates (i.e., there are K reliability values below the threshold), and then sort the K most unreliable candidates to determine the L most unreliable candidates (where K>L). In this manner, the number of values to be sorted is reduced to K. In yet another variation, a threshold is used as described above to generate the erasure list in the error erasure decoding system shown in FIG. 2.

According to another aspect of the invention, discussed below in a section entitled "Read Channel Interface," information is optionally exchanged in feed-forward or feedback configurations (or both) between the erasure set generation function 315 and the error-erasure Reed-Solomon decoder 330 to improve the performance of the magnetic recording system.

Iterative Error-Erasure Decoding Processes 400, 600, 800

Figure 4:
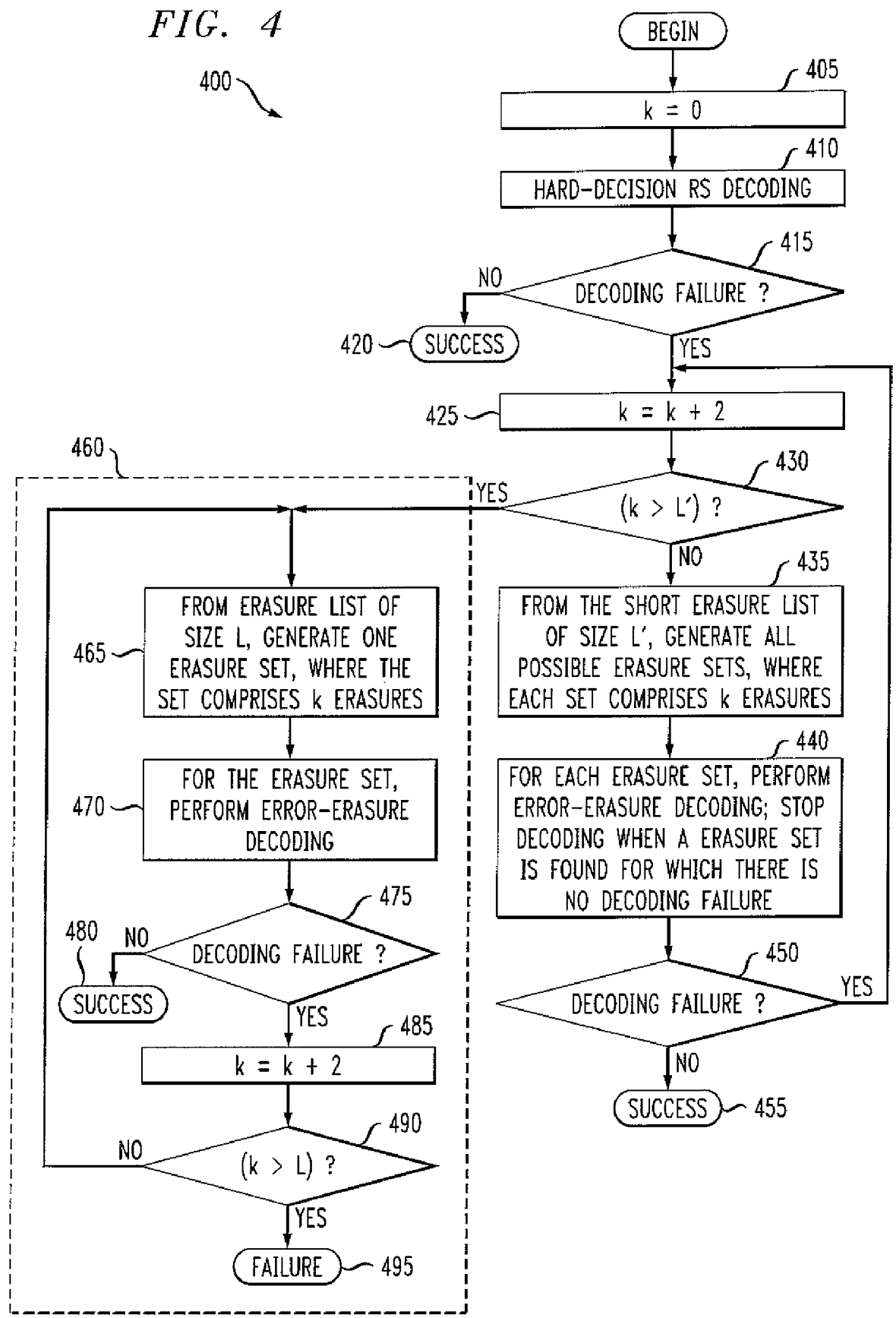
FIG. 4 is a flow chart describing an exemplary implementation of an iterative error-erasure decoding process that may be implemented by the iterative error-erasure decoding system of FIG. 3.

FIG. 4 is a flow chart describing an exemplary implementation of an iterative error-erasure decoding process 400 that may be implemented by the iterative error-erasure decoder 305 of FIG. 3. Generally, the iterative error-erasure decoding process 400 employs two list sizes L' and L, where L'<L. The two lists may be obtained using a thresholding or sorting technique. In a thresholding technique, all the symbols are obtained having a reliability value below a specified threshold. In a sorting technique, all the symbols are sorted based on the corresponding reliability value, and the L or L' most unreliable symbols are identified.

Initially, the iterative error-erasure decoding process initializes a counter, k, to zero during step 405. Thereafter, the iterative error-erasure decoding process performs a conventional hard-decision Reed-Solomon decoding process during step 410, in the manner described above in conjunction with FIG. 1. A test is performed during step 415 to determine if there was a decoding failure.

If it is determined during step 415 that there was no decoding failure, then a successful decoding is declared during step 420. If, however, it is determined during step 415 that there was a decoding failure, then the process proceeds to step 425 to initiate error-erasure decoding in accordance with the present invention.

As shown in FIG. 4, the iterative error-erasure decoding process increments the counter k by two during step 425. A test is performed during step 430 to determine if the counter, k, is greater than the list size L'. If it is determined during step 430 that the counter, k, is greater than the list size L', then the process proceeds to a subroutine 460, discussed below.

If, however, it is determined during step 430 that the counter, k, is not greater than the list size L', then all possible erasure sets are generated from the short erasure list of size L', during step 435, where each set comprises k erasures (and k is incremented by two upon each iteration to the next even value up to L', until no decoding error occurs). For each erasure set, the iterative error-erasure decoding process performs error-erasure decoding during step 440, until an erasure set is found for which there is no decoding failure. The decoding and the erasure set generation stop when an erasure set is found for which decoding succeeds.

Thus, a test is performed during step 450 to determine if a decoding failure is detected. If a decoding failure is detected during step 450, then the process returns to step 425 to increment the counter k by two and continue the error-erasure decoding for the next erasure set size, k.

If it is determined during step 450 that an erasure set is found for which there is no decoding error, then a successful decoding is declared during step 455.

As previously indicated, if it is determined during step 430 that the counter, k, is greater than the list size L', then error erasure decoding with the short list size L' did not succeed, and the process proceeds to a subroutine 460 where decoding is performed with the full list size L, as described below.

As shown in FIG. 4, the subroutine 460 first generates one erasure set, during step 465, from an erasure candidate list of size L, where the set comprises k erasures. Thereafter, for the erasure set, error-erasure decoding is performed during step 470. A test is performed during step 475 to determine if a decoding failure is detected. If it is determined during step 475 that a decoding failure is not detected, then a successful decoding is declared during step 480.

If, however, it is determined during step 475 that a decoding failure is detected, then the counter, k, is incremented by two during step 485. A further test is then performed during step 490 to determine if the current value of the counter, k, is greater than the full list size L. If it is determined during step 490 that the counter, k, is not greater than the full list size L, then the process returns to step 465 and continues processing in the manner described above, for the next value of k.

If, however, it is determined during step 490 that the counter, k, is greater than the full list size L, then a failure is declared during step 495.

FIG. 5 provides two examples 510, 550 that illustrate the processing of symbols by the iterative error-erasure decoding process 400 of FIG. 4. For example, example 510 illustrates a case where L equals 20 and L' equals 7. FIG. 5 employs a notation $$\binom{X}{Y}$$

that indicates all possible combinations of Y symbols out of X symbols (X over Y).

As shown in FIG. 5 for example 510, the iterative error-erasure decoding process 400 generates three subgroups (each even value of k up to L') of erasure sets 520 during step 435 (all erasure sets with 2 symbols out of the 7 most unreliable symbols, all erasure sets with 4 symbols out of the 7 most unreliable symbols and all erasure sets with 6 symbols out of the 7 most unreliable symbols) and generates one additional group of erasure sets 530, where each erasure set comprises k erasures, for each value of k between L' and L during step 465, starting with k equal to 8 (i.e., the first even value of k above L'), for a total of 70 erasure sets. The first group of erasure sets 520 includes all possible erasure sets, where each set contains k erasures, for each even increment value of k between 2 and L'. The second group of erasure sets 530 includes the erasure sets with k most unreliable symbols, for each even value of k that is greater than L' up to L.

In a further example of the processing performed by the iterative error-erasure decoding process 400, the example 550 illustrates the case where L' is 8 and L is 20, for a total of 133 erasure sets. The first group of erasure sets 560 includes four subgroups of erasure sets with an even number of erasures up to L' (all combinations of 2 symbols out of the 8 most unreliable symbols, all combinations of 4 symbols out of the 8 most unreliable symbols, all combinations of 6 symbols out of the 8 most unreliable symbols and all combinations of 8 symbols out of the 8 most unreliable symbols). The second group of erasure sets 570 includes the sets with the k most unreliable symbols, for each even value of k that is greater than L' up to L.

Figure 6:
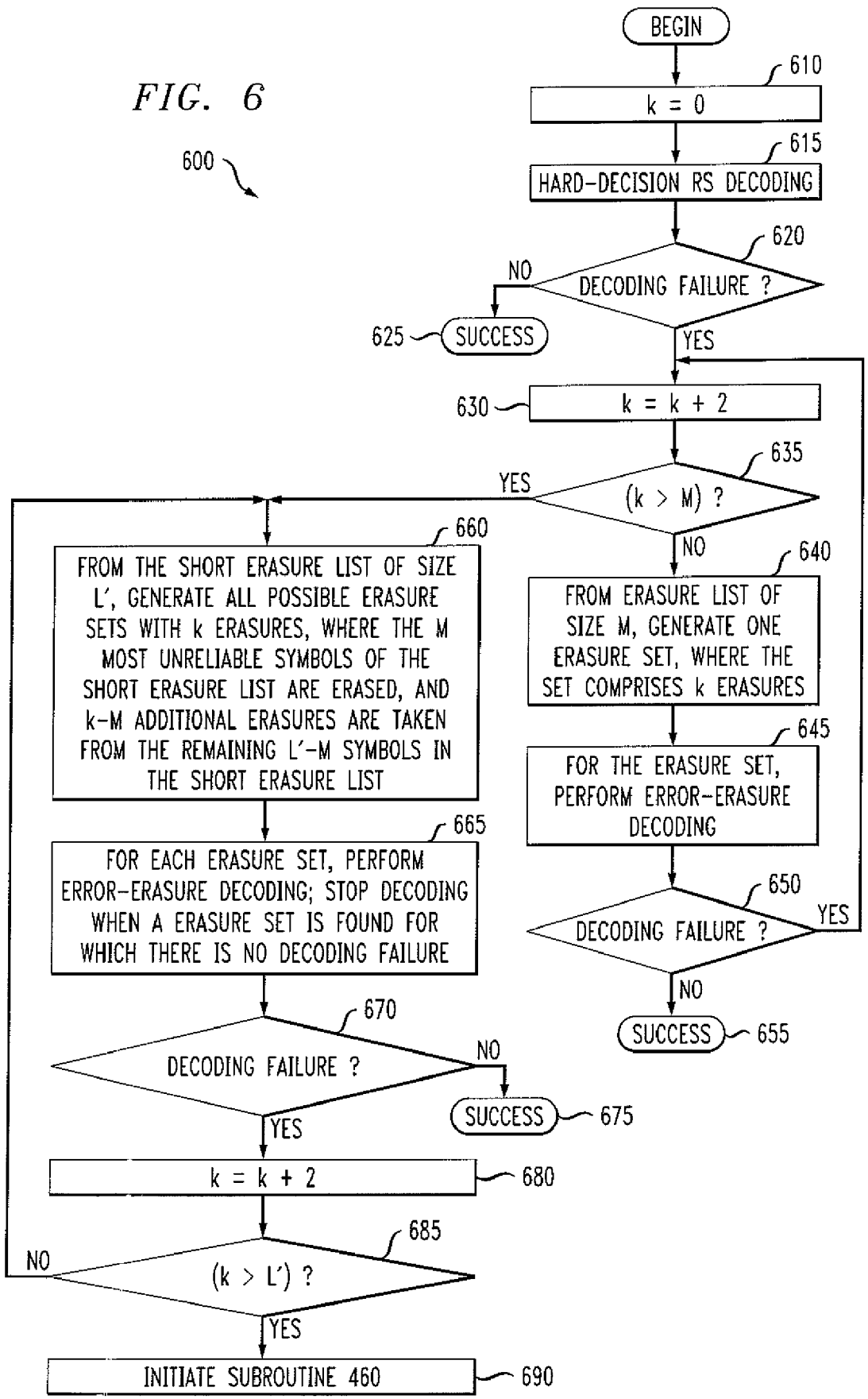
FIG. 6 is a flow chart describing an exemplary implementation of an alternative iterative error-erasure decoding process that may be implemented by the iterative error-erasure decoding system of FIG. 3.

FIG. 6 is a flow chart describing an exemplary implementation of an alternate iterative error-erasure decoding process 600 that may be implemented by the iterative error-erasure decoder 305 of FIG. 3. Generally, the iterative error-erasure decoding process 600 employs three list sizes M, L' and L, where M<L'<L. The lists may be obtained using a thresholding or sorting technique, in the manner described above.

As shown in FIG. 6, the iterative error-erasure decoding process 600 initializes a counter, k, to zero during step 610. Thereafter, the iterative error-erasure decoding process performs a conventional hard-decision Reed-Solomon decoding process during step 615, in the manner described above in conjunction with FIG. 1. A test is performed during step 620 to determine if there was a decoding failure.

If it is determined during step 620 that there was no decoding failure, then a successful decoding is declared during step 625. If, however, it is determined during step 620 that there was a decoding failure, then the counter k is incremented by two during step 630. A test is performed during step 635 to determine if the counter, k, is greater than the list size M. If it is determined during step 635 that the counter, k, is greater than the list size M, then the process proceeds to step 660, discussed below.

If, however, it is determined during step 635 that the counter, k, is not greater than the list size M, then one erasure set is generated during step 640 from the erasure candidate list of size M, where the set comprises k erasures. Error-erasure decoding is then performed during step 645 for the erasure set.

A test is performed during step 650 to determine if a decoding failure is detected. If it is determined during step 650 that there was no decoding failure, then a successful decoding is declared during step 655.

If, however, it is determined during step 650 that a decoding failure is detected, then the process returns to step 630 to increment the counter, k, and continue in the manner described above.

If it was determined during step 635 that the counter, k, is greater than the list size M, then the process proceeds to step 660. All possible erasure sets with k erasures are generated during step 660 from the short erasure list of size L', where the M most unreliable symbols of the short erasure list are erased, and k–M additional erasures are taken from the remaining L'–M symbols in the short erasure list. Error-erasure decoding is then performed during step 665 for each erasure set, until an erasure set is found for which there is no decoding error.

A test is performed during step 670 to determine if a decoding failure is detected. If it is determined during step 670 that there was no decoding failure, then a successful decoding is declared during step 675. The erasure set generation and decoding stop when an erasure set is found for which decoding succeeds. If, however, it is determined during step 670 that there was a decoding failure, then the counter, k, is incremented by two during step 680.

A further test is performed during step 685 to determine if the counter k is greater than the list size L'. If it is determined during step 685 that the counter k is not greater than the list size L', then the process returns to step 660. If, however, it is determined during step 685 that the counter k is greater than the list size L', then the process proceeds to step 690 where the subroutine 460 of FIG. 4 is executed.

FIG. 7 provides an example 710 that illustrates the processing of symbols in accordance with the iterative error-erasure decoding process 600 of FIG. 6 where L equals 20, L' equals 10 and M equals 4. As shown in FIG. 7, the iterative error-erasure decoding process 600 generates two subgroups (each even value up to M=4) of erasure sets 720 during two executions of step 640 (all combinations of 2 symbols out of the M=4 most unreliable symbols and all combinations of 4 symbols out of the M=4 most unreliable symbols) and, for each even value of k greater than M up to L', generates all possible erasure sets 730 during step 660 with the M most unreliable symbols from the short erasure list of size L' being erased and with k–M additional erasures taken from the remaining L'–M symbols in the short erasure list. For each erasure set in 730, the M most unreliable symbols are erased, and the other k-Madditional erasures are taken from the remaining L'–M erasures of the short list. In total, if all erasure sets are constructed for a given k, there are (L'–M) over (k–M) erasure sets. Finally, the iterative error-erasure decoding process 600 generates additional erasure sets 740, where each set contains k erasures during step 690 (using subroutine 460), for each even value of k greater than L' (starting with a value k that is the first even value greater than L') up to L, for a total of 38 erasure sets.

FIG. 8 is a flow chart describing an exemplary implementation of another alternate iterative error-erasure decoding process 800 that may be implemented by the iterative error-erasure decoder 305 of FIG. 3. As shown in FIG. 8, the iterative error-erasure decoding process 800 uses feedback information during step 810 to erase L" symbols. For example, the feedback information may come from the error-erasure Reed-Solomon decoder 330 to the erasure set generation function 315, as shown in FIG. 3 and discussed further below in the section entitled "Read Channel Interface." Thereafter, during step 820, the iterative error-erasure decoding process 800 constructs at least one erasure set, which includes the L" erased symbols and k–L" additional erasures taken from the short erasure list (comprised of L' erasures) or the long erasure list (comprised of L erasures). The feedback channel can provide, for example, information about symbols that are affected by defects on the magnetic storage medium, such as Thermal Asperity.

For example, if L equals 20 and L" equals 10, the erasure list generation process 800 erases L"=10 symbols based, for example, on information from the error-erasure Reed-Solomon decoder 330. Thereafter, the error-erasure decoding process 800 constructs additional k–L" erasure from the list of L=20, in a manner similar to step 660 of FIG. 6. For example, for k=14, an erasure set can include the L"=10 erased symbol, plus additional k–L"=4 erasures taken from the erasure list of size L.

Read Channel Interface

FIG. 9 is a schematic block diagram further illustrating the implementation of the iterative error-erasure decoding system of FIG. 3 in a magnetic recording system. According to another aspect of the invention, shown in FIG. 9 and discussed further below, the read channel 910 of the iterative error-erasure decoding system 300 of FIG. 3 provides an error-correction code (ECC) controller 950 with one or more of (i) position information; (ii) a symbol classification signal identifying the category or group of the symbol (or reliability information); and (iii) the detected symbols.

In addition, a feedback channel 960 from the ECC controller 950 to the read channel 910 can be employed in accordance with another aspect of the invention to control the erasure set generation by the erasure set generation function 315. For example, the thresholds employed by one or more of the iterative error-erasure decoding processes 400, 600, 800 can be adaptively set within the read channel 910 or by the ECC controller 950, to ensure that a sufficient number of symbols are flagged for inclusion in the lists of sizes M, L, or L". As previously indicated, a threshold may be employed in accordance with one aspect of the present invention to reduce the number of symbol values to be sorted so that the symbols can be determined, which are included in the erasure lists of size M, L, or L'. In an alternative embodiment, the number of symbols within the erasure list (e.g., the parameter L) or the number of symbols within an erasure sublist (e.g., the parameter M or L') can be adaptively set within the read channel 910 or by the ECC controller 950.

As shown in FIG. 9, the error-erasure Reed-Solomon decoder 330 of FIG. 3 is part of the ECC controller 950. In addition, the functionality of the bit-to-symbol conversion 310 or erasure set generation function 315 (or both) of FIG. 3 may be part of the read channel 910, the ECC controller 950 or both, as would be apparent to a person of ordinary skill in the art. The SOVA detector 302 is part of the read channel.

Typically, as shown in FIG. 2, the read channel of a prior art error-erasure decoding system 200, such as the bit-to-symbol converter 210, provides the ECC controller, such as the Reed-Solomon decoder 220, with each symbol and corresponding reliability value. In one implementation of the present invention, shown in FIG. 9, the read channel 910 of the iterative error-erasure decoding system 300 optionally provides the ECC controller 950 with the position and reliability value of only the L most unreliable symbols (in addition to each symbol value), for example, in a sorted or unsorted manner.

In a further variation of the present invention, shown in FIG. 9, the read channel 910 of the iterative error-erasure decoding system 300 optionally provides the ECC controller 950 with a classification signal for each symbol that associates the symbol with a group of symbols. For example, the classification signal can identify a first group of reliable symbols and a second group of unreliable symbols, e.g., marked by values of 0 and 1, respectively. In yet another variation, the classification signal can identify groups of reliable, unreliable and very unreliable symbols using values of 0, 1, and 2, respectively. Of course, the read channel 910 of the iterative error-erasure decoding system 300 can optionally provide the ECC controller 950 with a combination of the foregoing information, such as the position of the most unreliable symbols and a corresponding classification signal for each unreliable symbol.

In addition, as indicated above, a feedback channel 960 from the ECC controller 950 to the read channel 910 can be employed in accordance with another aspect of the invention to control the erasure set generation by the erasure set generation function 315. For example, the thresholds employed to generated the erasure list used by one or more of the iterative error-erasure decoding processes 400, 600, 800 can be adaptively set within the read channel 910 or by the error code correction (ECC) controller 950, to ensure that a sufficient number of symbols are flagged for inclusion in the respective erasure lists.

Thus, the ECC controller 950 optionally provides to the read channel 910 one or more of the following (i) one or more signals indicating whether one or more thresholds should be lowered or increased; (ii) one or more signals indicating whether one or more list sizes (e.g., values of M, L, L' or L") should be lowered or increased; or (iii) the position of symbols that are going to be erased anyway and therefore need not be included in the sorting or thresholding operation inside the read channel (such as the technique described above in conjunction with FIG. 8).

It has been found that a signal-to-noise ratio performance gain can be achieved with the disclosed iterative erasure decoding approach. In addition, the potential gain could be further increased by using additional side information from the outside world (e.g., ECC controller 380, as discussed in context of FIG. 9).

It is to be understood that the embodiments and variations shown and described herein are merely illustrative of the principles of this invention and that various modifications may be implemented by those skilled in the art without departing from the scope and spirit of the invention.

I claim:

1. A method for decoding a signal, comprising:
   obtaining a plurality of symbols associated with said signal and one or more corresponding reliability values;
   performing a first round of error-erasure decoding using a plurality of first erasure sets, wherein each of said first erasure sets comprises k erasures taken from a shortened erasure list comprised of L' symbols; and
   upon a predefined error condition, performing a second round of error-erasure decoding using one erasure set comprising n erasures taken from an erasure list comprised of L symbols, where n is larger than k and L larger than L'.

2. The method of claim 1, further comprising the step of constructing at least one erasure set that includes L" erased symbols and additional erasures taken from an erasure list.

3. The method of claim 2, wherein said L" erased symbols are identified using feedback information.

4. The method of claim 1, further comprising the steps of employing at least one threshold to mark K candidates having reliability values that satisfy said threshold, and sorting said K candidates to determine a number N of most unreliable candidates, where K is greater than N.

5. The method of claim 1, further comprising the steps of generating one or more reliability values using a soft-output detector, comparing said one or more reliability values to at least one threshold, and including symbols in an erasure list that satisfy said threshold.

6. The method of claim 1, further comprising the step of generating all possible erasure sets comprised of k symbols from said erasure list comprised of L' symbols.

7. The method of claim 1, wherein said step of performing a first round of error-erasure decoding further comprises the steps of:
   generating at least one shortened erasure list comprised of L' symbols;
   constructing a plurality of first erasure sets, wherein each of said first erasure sets comprises k erasures taken from said shortened erasure list;
   performing error-erasure decoding for said first erasure sets until a first erasure set is found for which there is no substantial decoding failure.

8. The method of claim 7, wherein said step of constructing a plurality of first erasure sets comprising k erasures comprises the steps of erasing the M most unreliable symbols from said at least one shortened erasure list, and taking k–M additional erasures from the remaining L'–M symbols of said at least one shortened erasure list.

9. The method of claim 7, further comprising the steps of:
   incrementing said value of k if a substantial decoding failure is detected; and
   repeating said constructing and performing steps if k does not exceed L'.

10. The method of claim 1, wherein said step of performing a second round of error-erasure decoding further comprises the steps of:
    generating at least one erasure list comprised of L symbols, where L is greater than L';
    constructing one erasure set comprising n erasures taken from said one erasure list of size L; and
    performing error-erasure decoding for said one erasure set.

11. The method of claim 10, further comprising the steps of:
    incrementing said value of n if a substantial decoding failure is detected for said error-erasure decoding of said one erasure set; and repeating said constructing and performing steps until said value of n exceeds said value of L.

12. The method of claim 1, further comprising a step of performing a pre-processing round of error-erasure decoding prior to said first round, wherein said pre-processing round comprises the steps of:
generating at least one erasure list comprised of M symbols;
constructing one erasure set comprising j erasures taken from said at least one erasure list of size M; and
performing error-erasure decoding for said one erasure set, where $L>L'>M$ and $n>k>j$.

13. The method of claim 12, further comprising the steps of:
incrementing said value of j if a substantial decoding failure is detected;
repeating said constructing and performing steps if j does not exceed M.

14. The method of claim 1, wherein said predefined error condition comprises k exceeding L'.

15. The method of claim 1, wherein said error-erasure decoding comprises Reed-Solomon decoding.

* * * * *